United States Patent
Lee et al.

(10) Patent No.: US 8,803,332 B2
(45) Date of Patent: Aug. 12, 2014

(54) DELAMINATION RESISTANCE OF STACKED DIES IN DIE SAW

(75) Inventors: Bo-I Lee, Sindian (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 394 days.

(21) Appl. No.: 12/831,875

(22) Filed: Jul. 7, 2010

(65) Prior Publication Data

US 2011/0062592 A1    Mar. 17, 2011

Related U.S. Application Data

(60) Provisional application No. 61/241,637, filed on Sep. 11, 2009.

(51) Int. Cl.
*H01L 23/48* (2006.01)
*H01L 23/52* (2006.01)
*H01L 29/40* (2006.01)
*H01L 23/02* (2006.01)
*H01L 23/28* (2006.01)
*H01L 21/00* (2006.01)
*H01L 21/44* (2006.01)

(52) U.S. Cl.
USPC ........... 257/777; 257/686; 257/774; 257/778; 257/787; 257/E23.067; 257/E23.174; 257/E21.597; 438/113; 438/127; 438/460; 438/667

(58) Field of Classification Search
None
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |

(Continued)

*Primary Examiner* — Hoang-Quan Ho
(74) *Attorney, Agent, or Firm* — Slater and Matsil, L.L.P.

(57) ABSTRACT

An integrated circuit structure includes a first die including TSVs; a second die over and bonded to the first die, with the first die having a surface facing the second die; and a molding compound including a portion over the first die and the second die. The molding compound contacts the surface of the second die. Further, the molding compound includes a portion extending below the surface of the second die.

20 Claims, 14 Drawing Sheets

(56) References Cited

U.S. PATENT DOCUMENTS

| | | | |
|---|---|---|---|
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,074,703 B2* | 7/2006 | Fukazawa | 438/598 |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2* | 5/2007 | Lee et al. | 257/777 |
| 7,276,799 B2 | 10/2007 | Lee et al. | |
| 7,279,795 B2 | 10/2007 | Periaman et al. | |
| 7,291,929 B2* | 11/2007 | Tanaka et al. | 257/784 |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,390,700 B2* | 6/2008 | Gerber et al. | 438/108 |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,531,905 B2* | 5/2009 | Ishino et al. | 257/777 |
| 7,537,959 B2* | 5/2009 | Lee et al. | 438/106 |
| 7,557,597 B2 | 7/2009 | Anderson et al. | |
| 7,576,435 B2 | 8/2009 | Chao | |
| 7,589,406 B2* | 9/2009 | Wood | 257/686 |
| 7,598,617 B2* | 10/2009 | Lee et al. | 257/777 |
| 7,598,618 B2* | 10/2009 | Shiraishi | 257/777 |
| 7,655,504 B2* | 2/2010 | Mashino | 438/109 |
| 7,824,960 B2* | 11/2010 | Hao et al. | 438/109 |
| 7,834,450 B2 | 11/2010 | Kang | |
| 7,867,821 B1* | 1/2011 | Chin | 438/107 |
| 7,884,459 B2* | 2/2011 | Yoshida et al. | 257/686 |
| 7,902,638 B2* | 3/2011 | Do et al. | 257/620 |
| 7,948,095 B2* | 5/2011 | Ng et al. | 257/790 |
| 8,101,460 B2* | 1/2012 | Pagaila et al. | 438/109 |
| 8,110,910 B2* | 2/2012 | Kim | 257/686 |
| 8,138,017 B2* | 3/2012 | Chin | 438/107 |
| 8,143,719 B2* | 3/2012 | Toh et al. | 257/723 |
| 8,446,000 B2* | 5/2013 | Shen et al. | 257/686 |
| 2002/0074637 A1* | 6/2002 | McFarland | 257/686 |
| 2005/0051883 A1* | 3/2005 | Fukazawa | 257/686 |
| 2005/0167812 A1* | 8/2005 | Yoshida et al. | 257/686 |
| 2005/0230804 A1* | 10/2005 | Tanida et al. | 257/690 |
| 2005/0263869 A1* | 12/2005 | Tanaka et al. | 257/686 |
| 2005/0280160 A1* | 12/2005 | Kim et al. | 257/777 |
| 2006/0073701 A1* | 4/2006 | Koizumi et al. | 438/666 |
| 2006/0261491 A1* | 11/2006 | Soeta et al. | 257/777 |
| 2006/0289992 A1* | 12/2006 | Wood | 257/738 |
| 2007/0007639 A1* | 1/2007 | Fukazawa | 257/686 |
| 2007/0090517 A1* | 4/2007 | Moon et al. | 257/706 |
| 2007/0126085 A1* | 6/2007 | Kawano et al. | 257/621 |
| 2007/0200216 A1* | 8/2007 | Kim et al. | 257/686 |
| 2007/0210447 A1* | 9/2007 | Kinsley | 257/723 |
| 2007/0222050 A1* | 9/2007 | Lee et al. | 257/678 |
| 2007/0281374 A1* | 12/2007 | Lee et al. | 438/14 |
| 2007/0287265 A1* | 12/2007 | Hatano et al. | 438/458 |
| 2008/0036082 A1* | 2/2008 | Eun | 257/737 |
| 2008/0237310 A1* | 10/2008 | Periaman et al. | 228/180.5 |
| 2008/0272464 A1* | 11/2008 | Do et al. | 257/620 |
| 2008/0272486 A1* | 11/2008 | Wang et al. | 257/737 |
| 2008/0272504 A1* | 11/2008 | Do et al. | 257/797 |
| 2009/0200662 A1* | 8/2009 | Ng et al. | 257/737 |
| 2009/0218671 A1* | 9/2009 | Kuwabara | 257/686 |
| 2009/0258459 A1* | 10/2009 | Gerber et al. | 438/107 |
| 2009/0302435 A1* | 12/2009 | Pagaila et al. | 257/659 |
| 2009/0321948 A1* | 12/2009 | Wang et al. | 257/777 |
| 2010/0013081 A1* | 1/2010 | Toh et al. | 257/692 |
| 2010/0109169 A1* | 5/2010 | Kolan et al. | 257/787 |
| 2010/0320587 A1* | 12/2010 | Lee et al. | 257/690 |
| 2010/0327465 A1* | 12/2010 | Shen et al. | 257/778 |
| 2011/0024888 A1* | 2/2011 | Pagaila et al. | 257/686 |

* cited by examiner

DELAMINATION RESISTANCE OF STACKED DIES IN DIE SAW

This application claims the benefit of U.S. Provisional Application No. 61/241,637 filed on Sep. 11, 2009, entitled "Delamination Resistance of Stacked Dies in Die Saw," which application is hereby incorporated herein by reference.

TECHNICAL FIELD

This disclosure relates generally to integrated circuits, and more particularly to methods of stacking dies, and even more particularly to package assemblies including stacked dies and methods of packaging the same.

BACKGROUND

Since the manufacturing of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuits (3D ICs) and stacked dies are commonly used. Through-silicon vias (TSVs) are often used in 3D ICs and stacked dies for connecting dies. In this case, TSVs are used to connect the integrated circuits on a die to the backside of the die. In addition, TSVs are also used to provide a short grounding path to connect the ground in the integrated circuits to the backside of the die, which is typically covered by a grounded aluminum film. Methods are thus being explored to enhance the stacking of dies comprising TSVs.

SUMMARY

In accordance with one aspect of the embodiment, an integrated circuit structure includes a first die including at least one through-silicon via (TSV); a second die over and bonded to the first die, with the first die having a surface facing the second die; and a molding compound including a portion over the first die and the second die. The molding compound contacts a surface of the second die. Further, the molding compound includes a portion extending below the surface of the second die.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

A novel package assembly comprising dies having through-silicon vias (TSVs) (also known as through-semiconductor vias or through-substrate vias) and the method of forming the same are presented. The intermediate stages of manufacturing an embodiment are illustrated. The variations of the embodiment are then discussed. Throughout the various views and illustrative embodiments, like reference numbers are used to designate like elements.

Figure 1A:
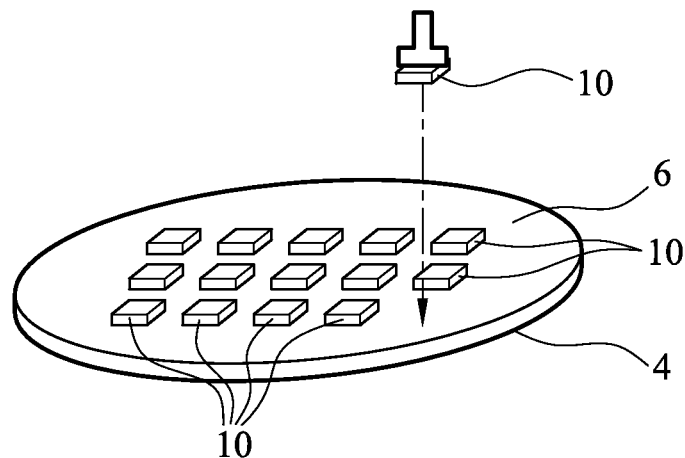
FIGS. 1A through 8 are perspective views and cross-sectional views of intermediate stages in the manufacturing of a package assembly in accordance with an embodiment, wherein redistribution lines and bumps of a die are formed before the die is bonded to another die.
Figure 1B:
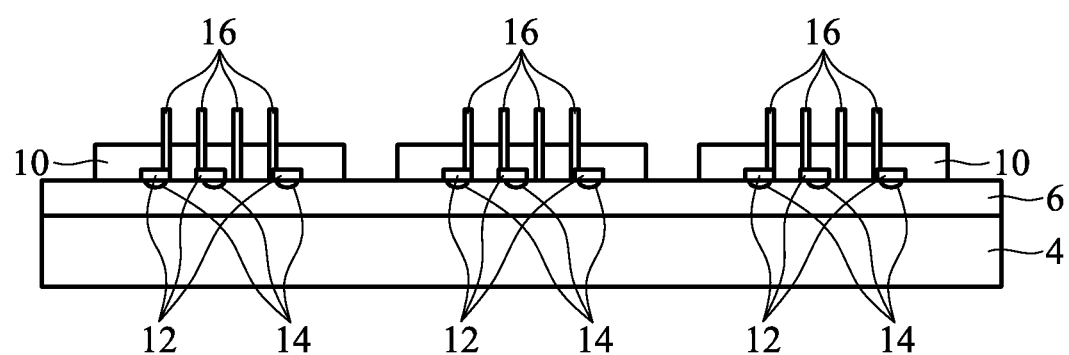

FIGS. 1A and 1B are a perspective view and a cross-sectional view, respectively, of an initial stage in accordance with an embodiment. Carrier 4 is provided, and mounting material 6 is applied on a side of carrier 4, so that mounting material 6 has a flat surface. Mounting material 6 may be applied to carrier 4 in a liquid form, and then cured. In an embodiment, mounting material 6 is removed in subsequent process steps, and may comprise reusable materials such as wax, adhesives (glues), b-stage materials, and the like. The reusable material may be collected after it is removed from carrier 4, and may be reused on other carriers. Accordingly, mounting material 6 is also referred to as reusable material 6.

TSV dies 10, which comprise TSVs 16 therein, are mounted on mounting material 6. In an embodiment, before TSV dies 10 are mounted on mounting material 6, redistribution lines (RDLs) 12 and bumps 14 (FIG. 1B) are pre-formed on the front sides (the sides facing down in FIG. 1B) of TSV dies 10. TSVs 16 are formed in the semiconductor substrates (for example, silicon substrates) (not shown) in TSV dies 10. In an embodiment, as shown in FIG. 1B, TSVs 16 penetrate through the semiconductor substrate and protrude out of the back sides (the sides facing up in FIG. 1B) of TSV dies 10 in the form of copper-containing bumps (for example, copper posts). In alternative embodiments, TSVs 16 are connected to bond pads (not shown) that are formed on the backsides of TSV dies 10.

Figure 2A:
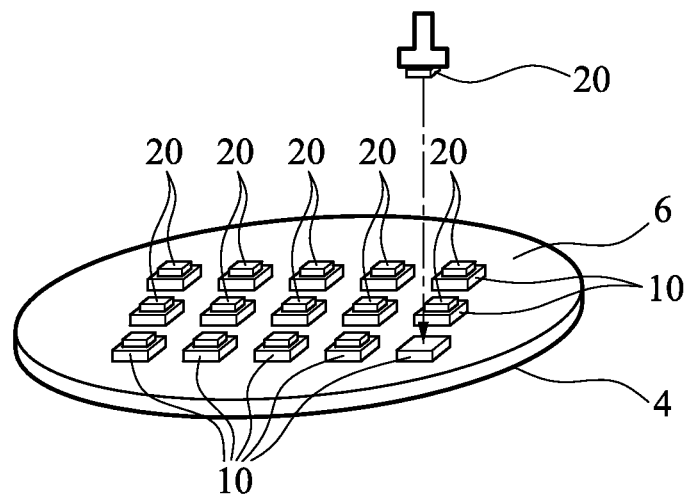
Figure 2B:
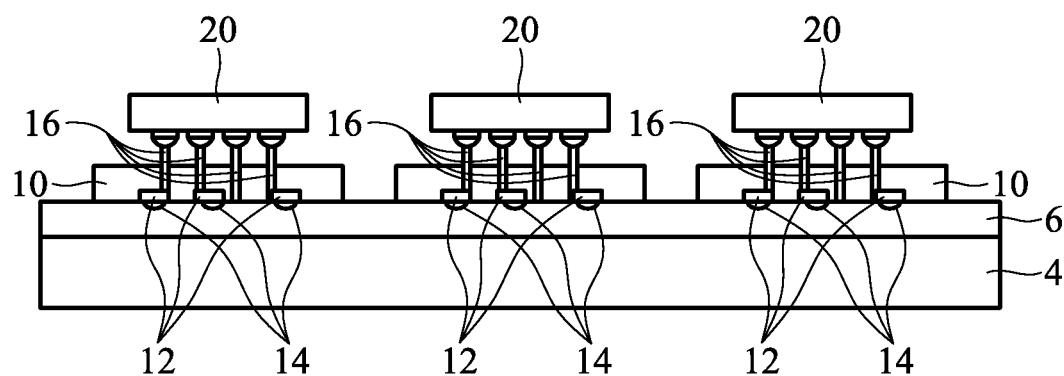
Figure 3:
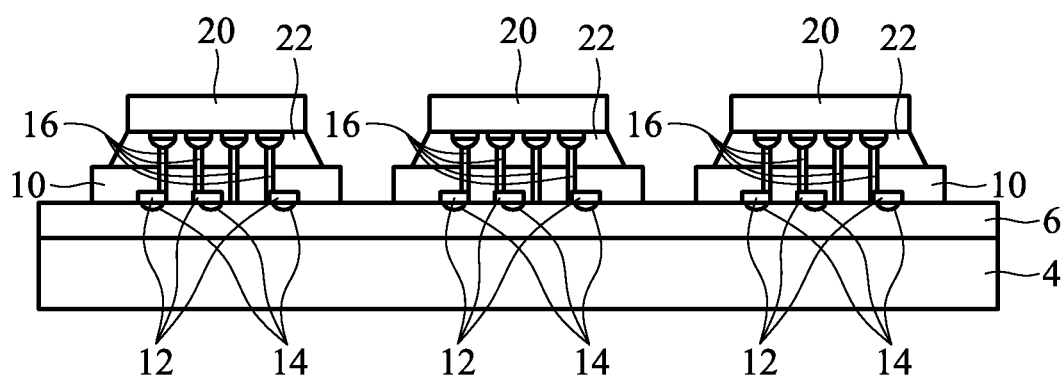

Referring to FIGS. 2A and 2B, top dies 20 are bonded onto TSV dies 10, for example, through flip-chip bonding. The circuits in top dies 20 are electrically connected to TSVs 16 in TSV dies 10. Top dies 20 and TSV dies 10 may include integrated circuits (not shown), such as complementary metal-oxide-semiconductor (CMOS) transistors, therein. Top dies 20 may have sizes smaller than, equal to, that of TSV dies 10. In FIG. 3, underfill 22 is dispensed into the space between top dies 20 and TSV dies 10 to protect the bonds. Underfill 22 is then cured.

Figure 4A:
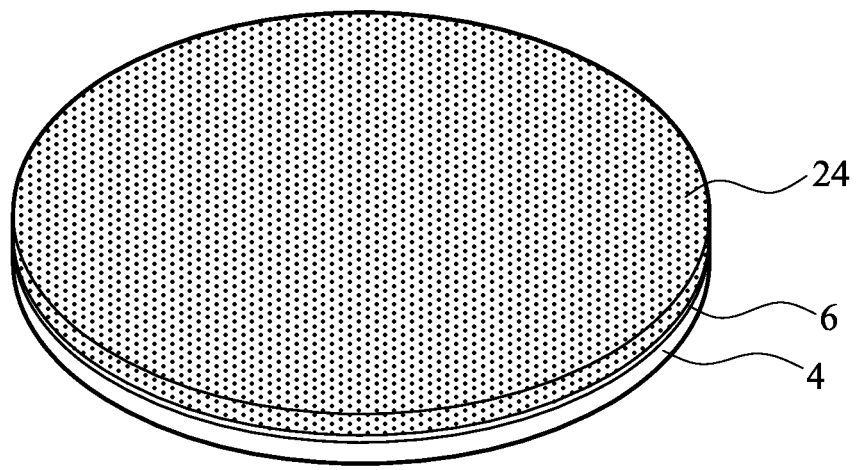
Figure 4B:
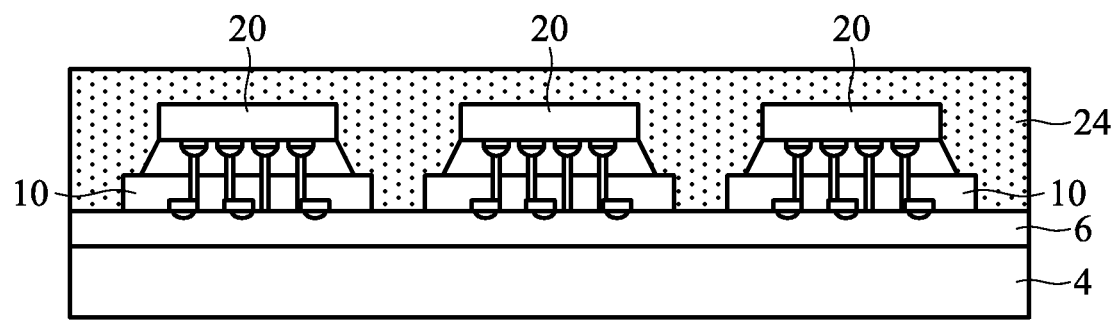

Referring to FIGS. 4A and 4B, which are a perspective view and a cross-sectional view, respectively, of a same structure, a wafer-level molding is performed, and molding compound 24 is molded to cover top dies 20 and TSV dies 10. After being cured, the resulting molding compound 24 has a flat top surface. Molding compound 24 provides protection to the stacked structure, and is left in the final structure. Accordingly, molding compound 24 may use commonly used molding compound materials such as resins. FIG. 4B illustrates that molding compound 24 is filled into the space between TSV dies 10 and contacting mounting material 6. The bottom surface of molding compound 24 may also be substantially level with the bottom surfaces of TSV dies 10. Accordingly, top dies 20 are spaced apart from each other by molding compound 24, and TSV dies 10 are spaced apart from each other by molding compound 24.

Figure 5:
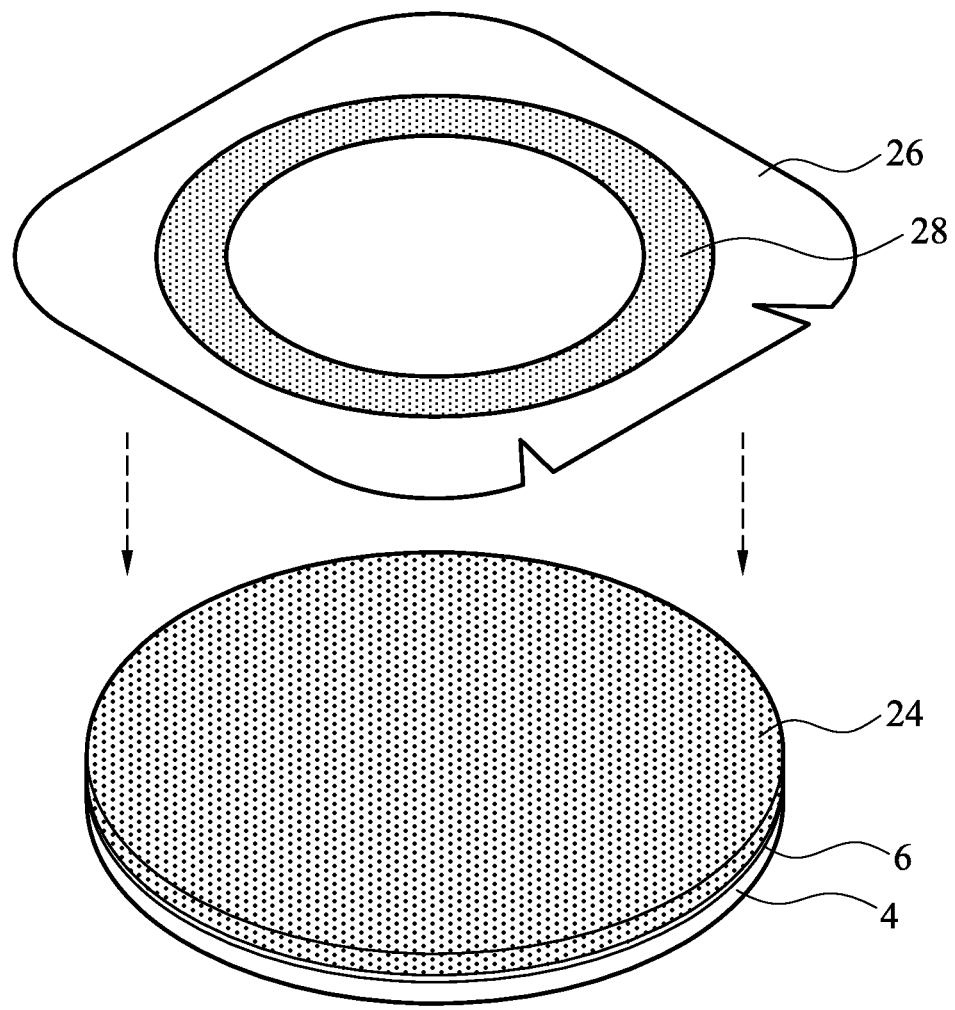
Figure 6A:
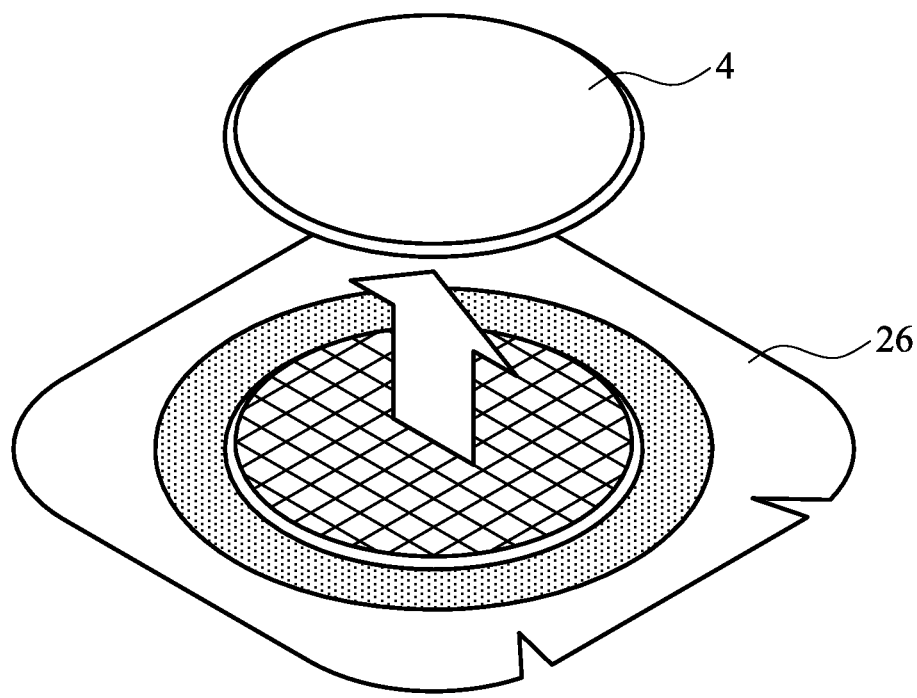
Figure 6B:
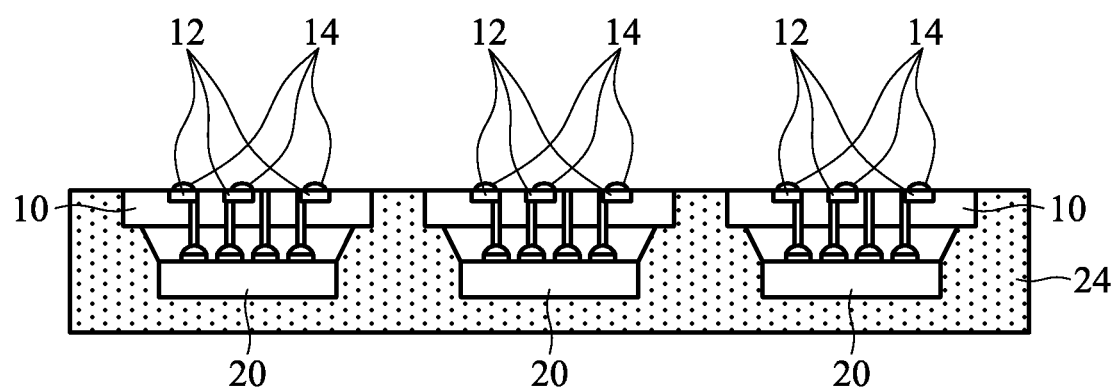

FIG. 5 illustrates dicing tape 26 being mounted onto molding compound 24. Dicing tape 26 may include dicing frame 28 therein. After being mounted, dicing tape 26 is adhered to molding compound 24. Next, as shown in FIGS. 6A (a perspective view) and 6B (a cross-sectional view), carrier 4 is de-bonded from molding compound 24 through the removal of mounting material 6. Depending on the material used for mounting material 6, the removal may be performed using water or other solvents. In the embodiments wherein mounting material 6 is reusable, after the step as shown in FIGS. 6A and 6B is performed, removed reusable material 6 may be collected and reused. In the reuse of the reusable material, the process steps as shown in FIGS. 1 and 5 are repeated to bond additional top dies to additional TSV dies, and the collected reusable material 6 may be applied (on other carriers similar to carrier 4) to form another mounting material 6, which is similar to what is shown in FIG. 2. In other embodiments, carrier 4 is adhered to TSV dies 10 through an ultra-violet (UV) glue, and hence may be de-bonded by exposing the UV glue to a UV light.

Figure 7:
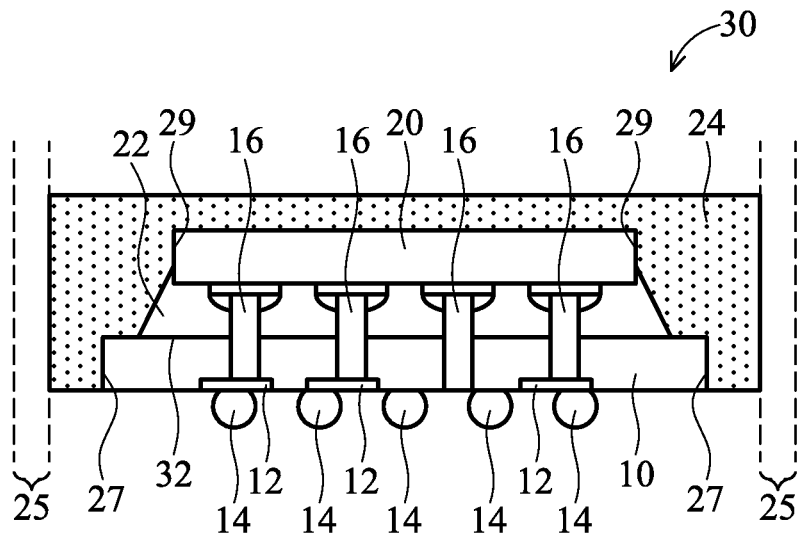

Next, a die saw is performed to the structure as shown in FIGS. 6A and 6B. A cross-sectional view of a piece of the resulting stacked dies (referred to as wafer-level molding units 30 hereinafter) is shown in FIG. 7. In the die-saw, kerf lines 25 are spaced apart from the edges 27 of TSV dies and edges 29 of top dies 20. In a resulting wafer-level molding unit 30, both top die 20 and TSV dies 10 are covered by molding compound 24, and edges 27 of TSV die 10 and edges 29 of top die 20 are covered by molding compound 24. It is observed that since molding compound 24 extends below surface 32 (the back surfaces of TSV die 10 facing top die 20), the delamination that may occur during the sawing of the stacking structure is reduced. The reliability test result of the resulting package assembly is also improved.

Figure 8:
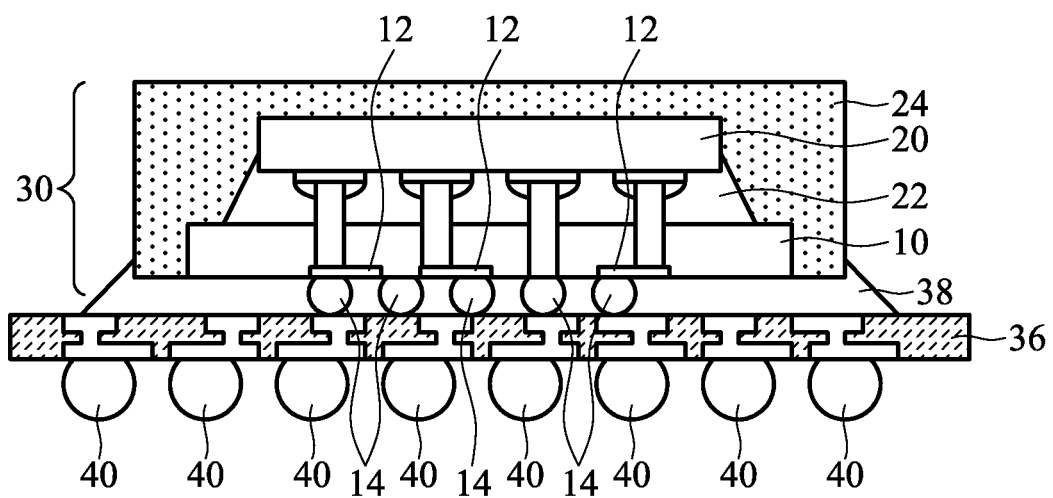

Referring to FIG. 8, wafer-level molding unit 30 is bonded onto package substrate 36 through bumps 14. In alternative embodiments, wafer-level molding unit 30 may be bonded onto package substrate 36 through wire bonding (not shown). Underfill 38 is also dispensed between wafer-level molding unit 30 and package substrate 36. Ball-grid-array (BGA) balls 40, which are solder balls, may also be mounted onto package substrate 36.

Figure 9A:
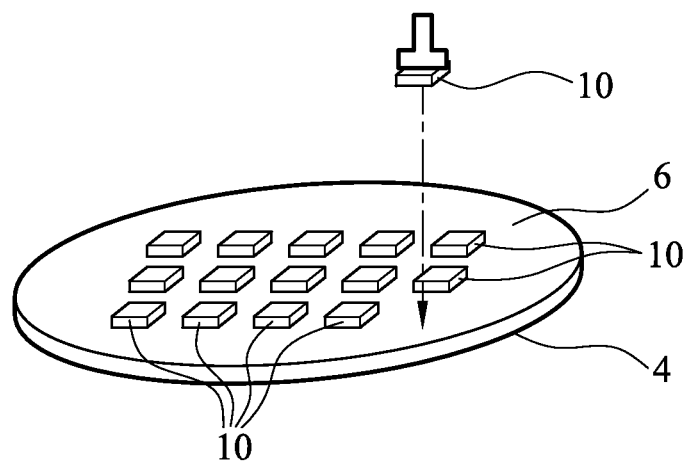
FIGS. 9A through 17 are perspective views and cross-sectional views of intermediate stages in the manufacturing of a package assembly in accordance with another embodiment, wherein redistribution lines and bumps of a die are formed after the die is bonded to another die.
Figure 9B:
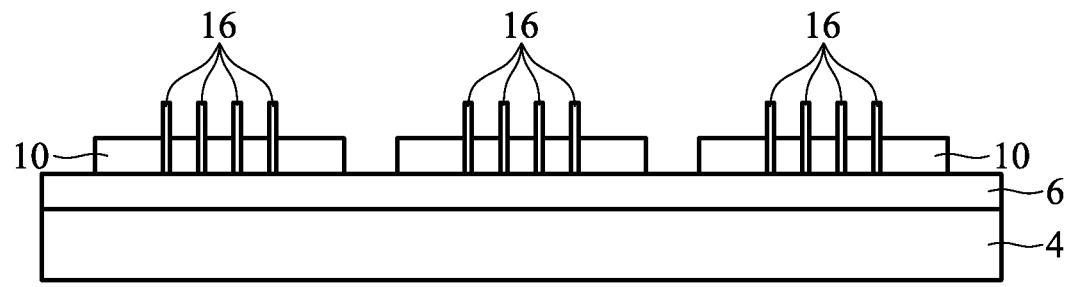

FIGS. 9A through 17 illustrate an alternative embodiment. In this embodiment, RDLs 12 and bumps 14 (refer to FIG. 15), instead of being pre-formed before TSV dies 10 are mounted on mounting material 6, are formed after carrier 4 is de-bonded. Unless specified otherwise, like reference numerals used in this embodiment represent like elements used in the preceding embodiment. The materials and process details of this embodiment may also be found by referring to the embodiment shown in FIGS. 1A through 8. Referring to FIGS. 9A and 9B, which are a perspective view and a cross-sectional view of a same structure, respectively, TSV dies 10 are mounted on mounting material 6, which is further applied on carrier 4. No RDLs and bumps are formed on the front sides (the sides facing down in FIG. 9B) of TSV dies 10.

Figure 10A:
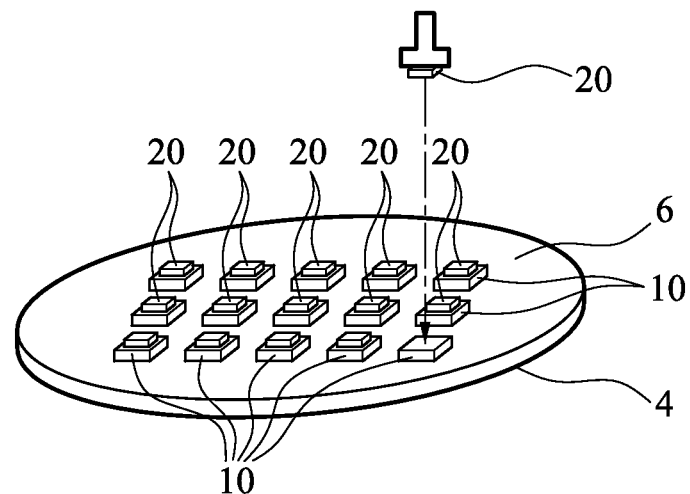
Figure 10B:
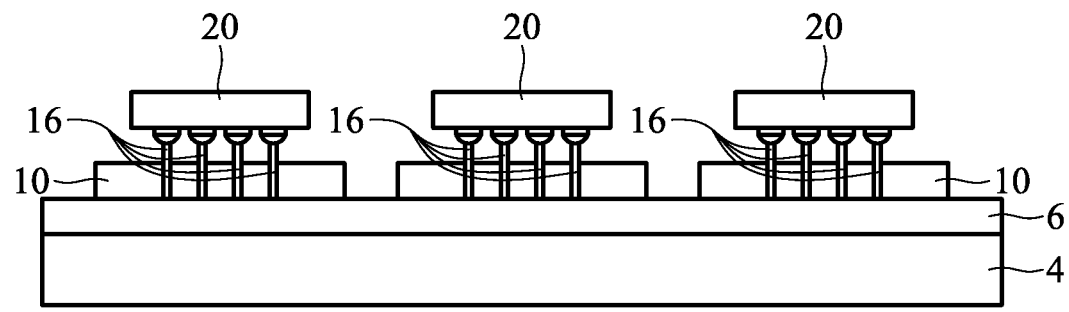
Figure 11A:
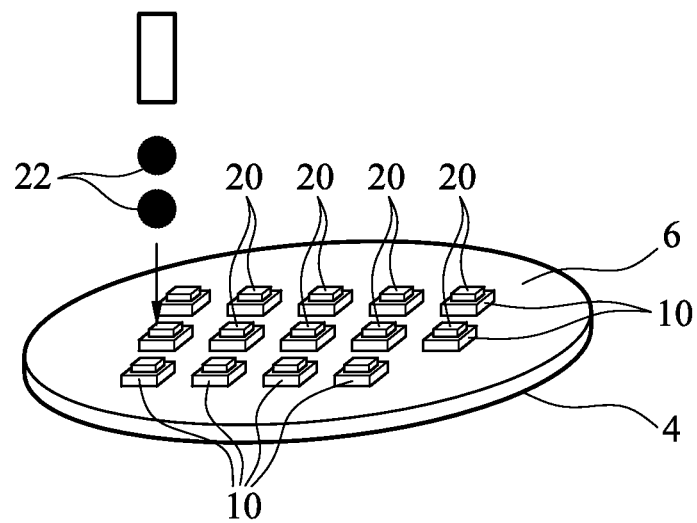
Figure 11B:
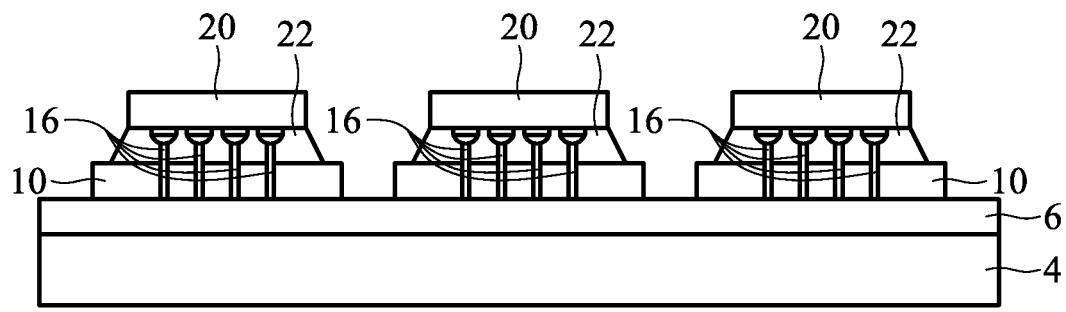
Figure 12A:
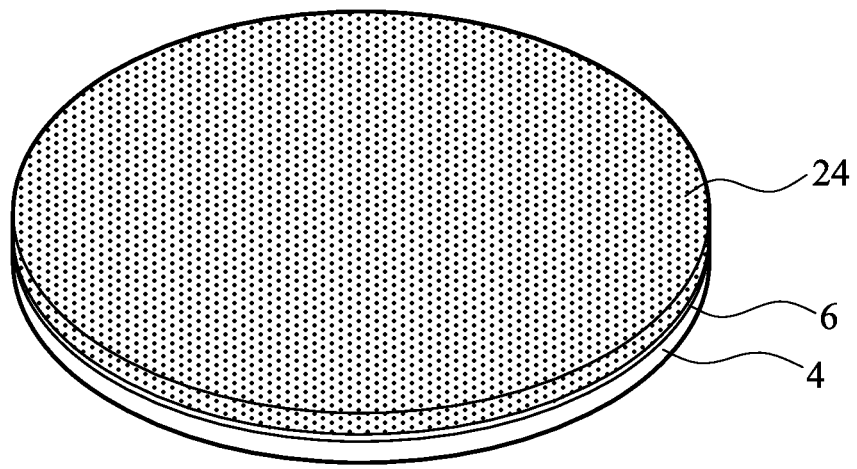
Figure 12B:
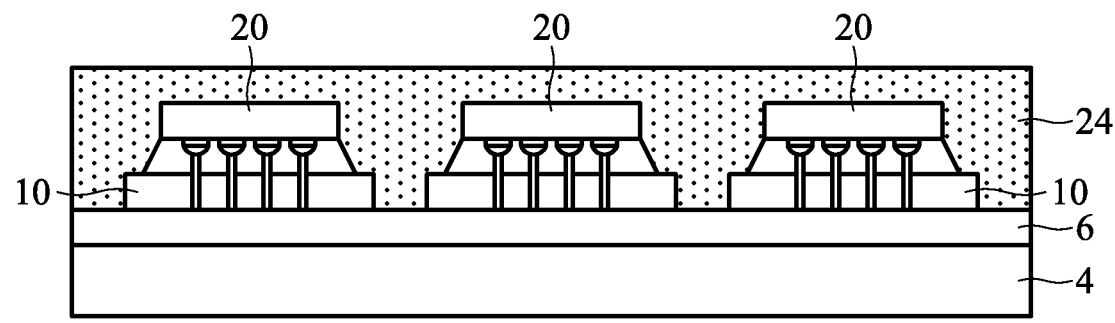
Figure 13:
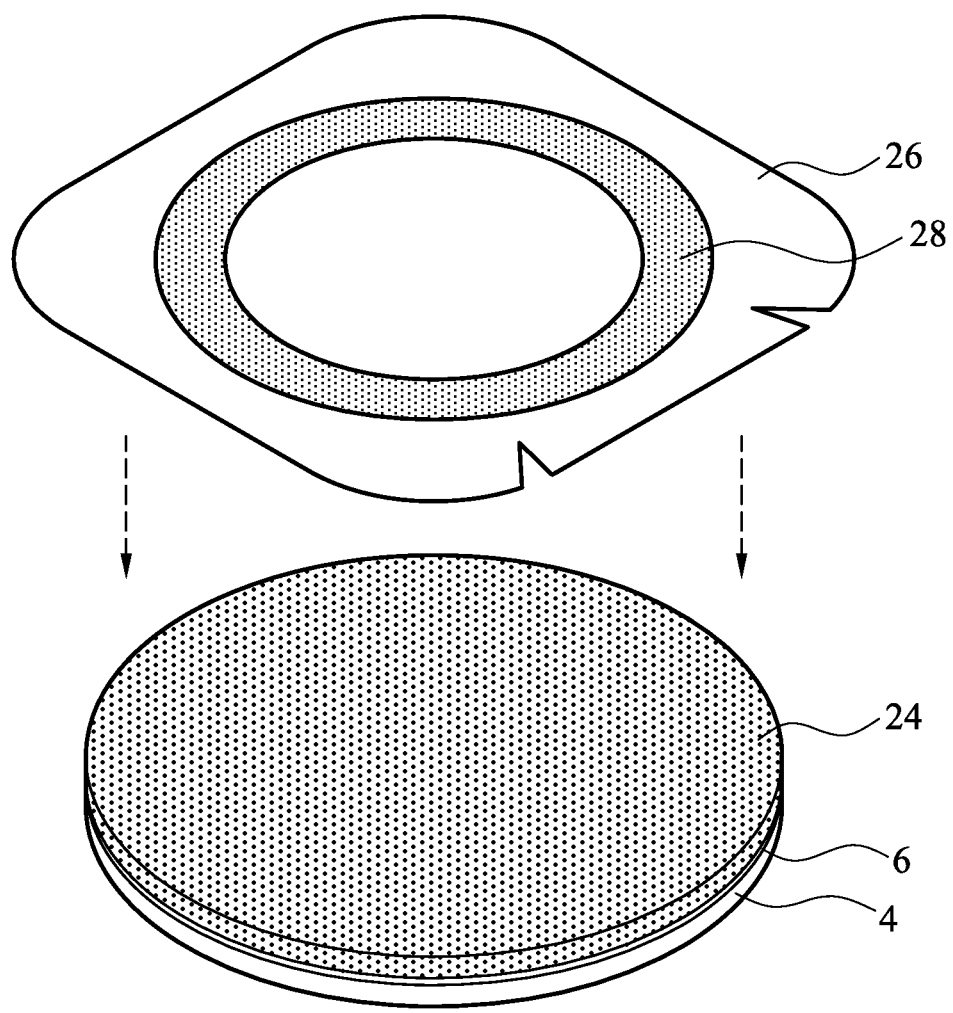
Figure 14A:
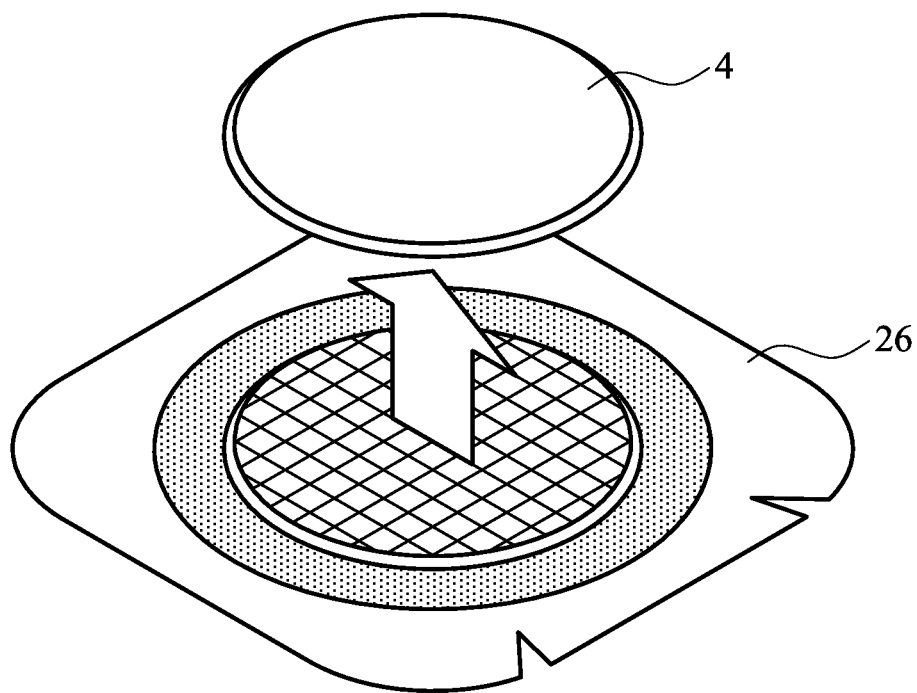
Figure 14B:
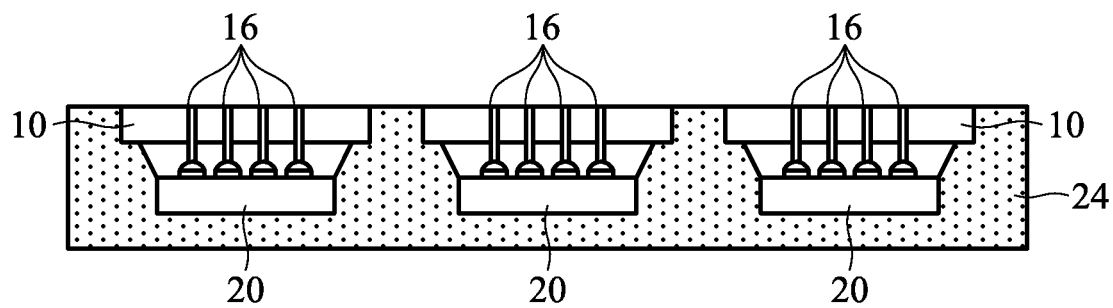

The process steps shown in FIGS. 10A through 15 are essentially the same as shown in FIGS. 2 through 6. In FIGS. 10A and 10B, top dies 20 are bonded onto TSV dies 10. Underfill 22 is then dispensed to between top dies 20 and TSV dies 10, as shown in FIGS. 11A and 11B. Referring to FIGS. 12A and 12B, a wafer-level molding is performed to cover top dies 20 and TSV dies 10 with molding compound 24. In FIG. 13, dicing tape 26 is mounted onto molding compound 24, followed by the de-bonding of carrier 4, as shown in FIGS. 14A and 14B.

Figure 15:
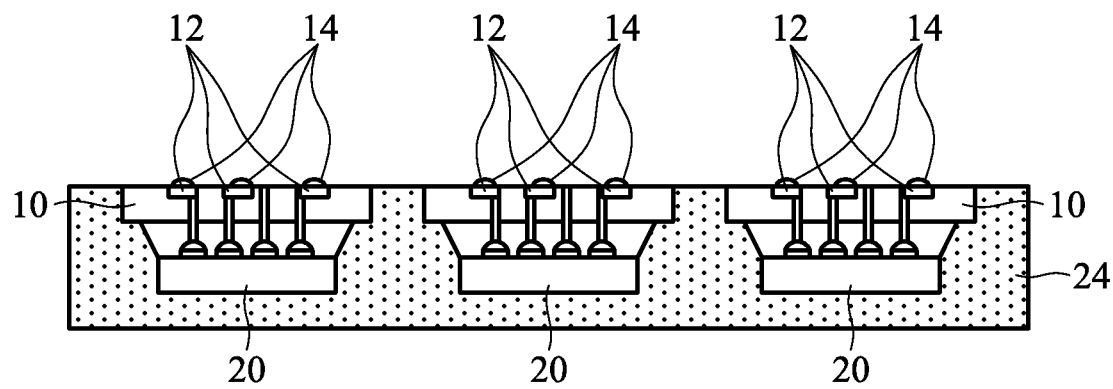
Figure 16:
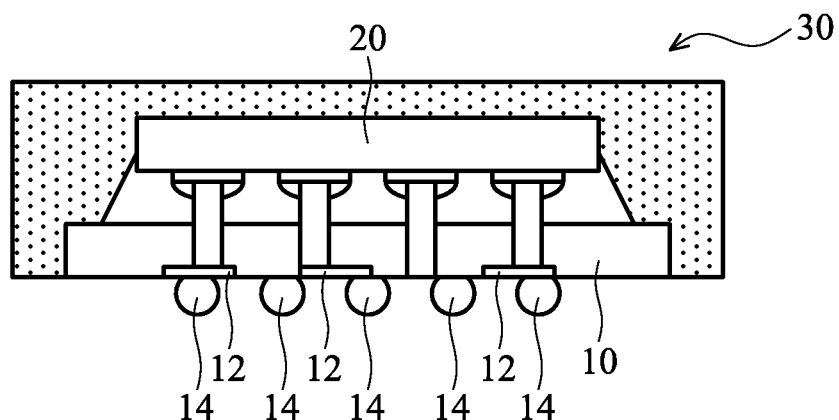
Figure 17:
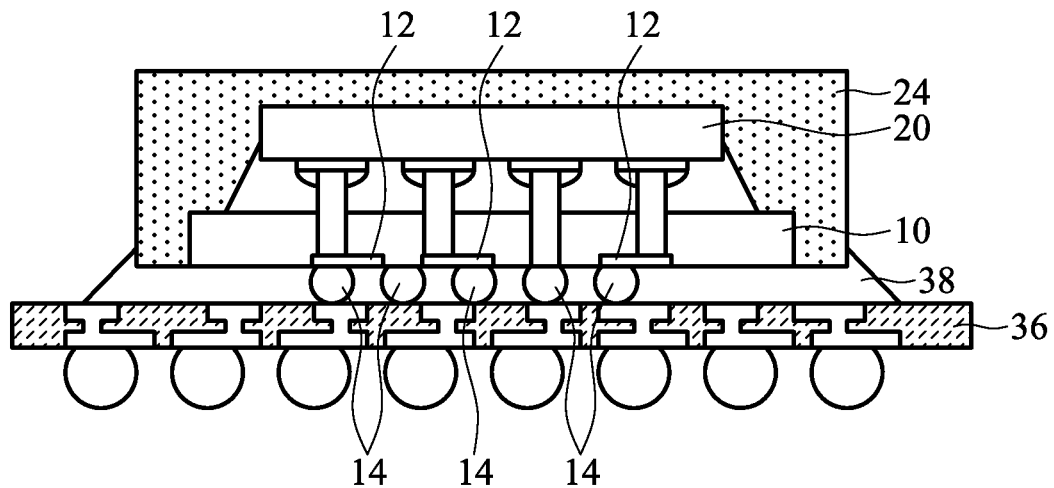

Next, as shown in FIG. 15, RDLs 12 and bumps 14 are formed. The formation details of RDLs 12 and bumps 14 are known in the art, and hence are not discussed herein. Next, a die saw is performed on the structure as shown in FIG. 15, and one of the resulting wafer-level molding units 30 is illustrated in FIG. 16. Again, during the die saw, kerf lines are spaced apart from edges of top dies 20 and TSV dies 10, and hence edges of top dies 20 and TSV dies 10 are not exposed. FIG. 17 illustrates the bonding of wafer-level molding unit 30 onto package substrate 36.

The embodiments have several advantageous features. By allowing the molding compound to extend below the surfaces of TSV dies 10 facing top dies 20, the likelihood of delamination and cracking in the die-saw process is reduced. The reliability of the resulting package assemblies is thus improved.

Although the embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the embodiments.

What is claimed is:

1. An integrated circuit structure comprising:
a first die comprising at least one through-substrate via (TSV), the first die further comprising a first surface and a second surface opposite the first surface, the second surface having at least one redistribution line disposed thereon, the at least one TSV extending from the at least one redistribution line through the first die and above the first surface;

a second die over and bonded to the first die, the first surface of the first die spaced apart from and facing the second die, the second die in electrical contact with the at least one TSV;

a molding compound comprising a portion over the first die and the second die, wherein the molding compound contacts the first surface of the first die, and wherein the molding compound comprises a first portion extending below the first surface of the first die and further comprises a bottom surface that is about level with the second surface of the first die;

at least one connector different from the at least one TSV and disposed on the second surface of the first die; and a package substrate underlying and bonded to the first die by the at least one connector, wherein the molding compound is spaced apart from the package substrate.

2. The integrated circuit structure of claim 1, wherein the molding compound further comprises a second portion directly over the first die, and wherein the first portion and the second portion are formed of a same material.

3. The integrated circuit structure of claim 1, wherein the second die is bonded to the TSV in the first die.

4. The integrated circuit structure of claim 1, wherein the second die has a size smaller than the first die.

5. An integrated circuit structure comprising:
a bottom die comprising through-substrate vias (TSVs), the TSVs extending through bottom die and above a first side, the bottom die having a second side opposite the first side;
a top die over and bonded to the TSVs of the bottom die, the first side of the bottom die facing the top die;
a molding compound comprising a first portion over the bottom die and the top die, a second portion contacting side edges of the bottom die and the top die, and a bottommost surface level with a bottom surface of the bottom die; and
a package substrate underlying and bonded at a first side to the second side of the bottom die by first connectors different than the TSVs, the package substrate spaced apart from the bottom die, the package substrate having second connectors mounted on a second side opposite the first side;
wherein edges of the molding compound are misaligned with respective edges of the package substrate.

6. The integrated circuit structure of claim 5, wherein a portion of the first side of the bottom die contacts the molding compound.

7. The integrated circuit structure of claim 5, wherein the top die and the bottom die are bonded through flip-chip bonding.

8. The integrated circuit structure of claim 5, wherein the first portion and the second portion of the molding compound are formed of a same material.

9. The integrated circuit structure of claim 5, wherein the molding compound is spaced apart from the package substrate.

10. The integrated circuit structure of claim 5, wherein the top die has a size smaller than the bottom die.

11. A method of forming an integrated circuit structure, the method comprising:
mounting a mounting material in a liquid form onto a carrier;
curing the mounting material;
placing a bottom die on the cured mounting material;
bonding a top die over the bottom die, wherein the bottom die comprises a surface facing the top die, and wherein the bottom die comprises through-substrate vias (TSVs) therein;
molding a molding compound onto the bottom die and the top die, wherein the molding compound contacts the surface of the top die, and wherein the molding compound comprises a portion extending below the surface of the top die; and
after the molding compound is molded, sawing the molding compound.

12. The method of claim 11 further comprising:
mounting a dicing tape onto the molding compound; and
removing the mounting material to separate the molding compound, the top die, and the bottom die from the carrier.

13. The method of claim 12 further comprising:
after the step of removing the mounting material from over the top die, collecting the mounting material; and
re-applying the mounting material that is collected onto an additional carrier.

14. The method of claim 11 further comprising, before the step of bonding the top die to the bottom die, forming redistribution lines and bumps on the bottom die.

15. The method of claim 11 further comprising, after the step of molding the molding compound, forming redistribution lines and bumps on the bottom die.

16. The method of claim 11 further comprising:
after the step of sawing the molding compound, bonding a package substrate with the bottom die.

17. The integrated circuit structure of claim 1, wherein edges of the molding compound are misaligned with respective edges of the package substrate.

18. The integrated circuit structure of claim 1, wherein the at least one connector is mounted on the at least one redistribution line and is in electrical contact with the at least one TSV by way of the at least one redistribution line, and wherein the at least one connector is non aligned with the at least one TSV.

19. The integrated circuit structure of claim 1, wherein the molding compound contacts the first surface of the first die.

20. The integrated circuit structure of claim 5, wherein the second connectors are each non-aligned with respective ones of the TSVs.

* * * * *